(12) United States Patent
Kang et al.

(10) Patent No.: US 8,524,569 B2
(45) Date of Patent: Sep. 3, 2013

(54) METHODS OF FORMING AN ISOLATION LAYER AND METHODS OF MANUFACTURING SEMICONDUCTOR DEVICES HAVING AN ISOLATION LAYER

(75) Inventors: Dae-Hyuk Kang, Hwaseong-si (KR); Jung-Won Lee, Gunpo-si (KR); Bo-Un Yoon, Seoul (KR); Kun-Tack Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 288 days.

(21) Appl. No.: 13/109,527

(22) Filed: May 17, 2011

(65) Prior Publication Data
US 2011/0281415 A1 Nov. 17, 2011

(30) Foreign Application Priority Data
May 17, 2010 (KR) .................. 10-2010-0045900

(51) Int. Cl.
*H01L 21/76* (2006.01)
*H01L 21/331* (2006.01)
*H01L 21/336* (2006.01)

(52) U.S. Cl.
USPC ........... 438/421; 438/400; 438/424; 438/427; 438/428; 438/353; 438/294; 438/295; 438/296; 438/359; 257/E21.24; 257/E21.545; 257/E21.546; 257/E21.548; 257/E21.549

(58) Field of Classification Search
USPC ........... 438/421, 424, 427, 428; 257/E21.24, 257/E21.545, E21.546, E21.548, E21.549, 257/E21.573
See application file for complete search history.

(56) References Cited

U.S. PATENT DOCUMENTS

| 2007/0262393 A1* | 11/2007 | Yoon et al. | 257/374 |
|---|---|---|---|
| 2008/0213969 A1* | 9/2008 | Seo | 438/424 |
| 2009/0170276 A1* | 7/2009 | Kim | 438/421 |
| 2010/0093166 A1* | 4/2010 | Kim et al. | 438/589 |
| 2010/0304549 A1* | 12/2010 | Dong et al. | 438/435 |

FOREIGN PATENT DOCUMENTS

| JP | 2007-184489 | 7/2007 |
|---|---|---|
| KR | 1020050055074 A | 6/2005 |
| KR | 1020090107742 A | 10/2009 |

* cited by examiner

*Primary Examiner* — Mohsen Ahmadi
(74) *Attorney, Agent, or Firm* — Myers Bigel Sibley & Sajovec, P.A.

(57) ABSTRACT

In a method of forming an isolation layer, first and second trenches are formed on a substrate. The first and the second trenches have first and second widths, respectively, and the second width is greater than the first width. A second isolation layer pattern partially fills the second trench. A first isolation layer pattern and the third isolation layer pattern are formed. The first isolation layer pattern fills the first trench, and the third isolation layer pattern is formed on the second isolation layer pattern and fills a remaining portion of the second trench.

14 Claims, 11 Drawing Sheets

METHODS OF FORMING AN ISOLATION LAYER AND METHODS OF MANUFACTURING SEMICONDUCTOR DEVICES HAVING AN ISOLATION LAYER

CLAIM OF PRIORITY

This application claims priority under 35 USC §119 to Korean Patent Application No. 2010-0045900, filed on May 17, 2010 in the Korean Intellectual Property Office (KIPO), the contents of which are herein incorporated by reference in their entirety.

BACKGROUND

1. Field

Example embodiments relate to methods of forming an isolation layer, semiconductor devices having an isolation layer, and methods of manufacturing the same.

2. Description of the Related Art

To isolate unit cells of semiconductor devices electrically, a trench may be formed on a substrate and an isolation layer may be formed to fill the trench using a dielectric material. An annealing process may be performed on the isolation layer and the isolation layer may shrink during the annealing process. The shrinkage of the isolation layer may cause a defect at the isolation layer or layers adjacent to the isolation layer, so that electrical characteristics of the semiconductor device may deteriorate.

Figure 1:
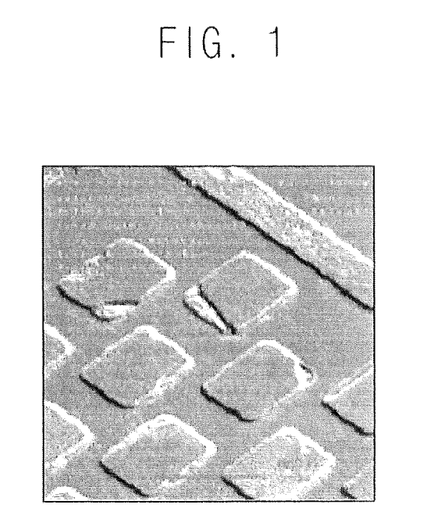
FIG. 1 is a microphotograph of a flash memory device having an isolation layer on which an annealing process has been performed.

FIG. 1 is a microphotograph of a flash memory device having an isolation layer on which an annealing process has been performed. Referring to FIG. 1, defects are generated close to the isolation layer.

SUMMARY

Example embodiments provide a method of forming an isolation layer having reduced defects.

Example embodiments provide a semiconductor device including an isolation layer having reduced defects.

Example embodiments provide a method of manufacturing a semiconductor device having reduced defects.

According to example embodiments, there is provided a method of forming an isolation layer. In the method, a first trench and a second trench are formed at upper portions of a substrate. The first and the second trenches have first and second widths, respectively, and the second width is greater than the first width. A second isolation layer pattern is formed to partially fill the second trench. A first isolation layer pattern and a third isolation layer pattern are formed. The first isolation layer pattern fills the first trench, and the third isolation layer pattern is formed on the second isolation layer pattern and fills a remaining portion of the second trench.

In example embodiments, the second isolation layer pattern may be formed using a material having a thermal shrinkage lower than those of the first and the third isolation layer patterns.

In an example embodiment, the second isolation layer pattern may be formed using boro-phosphor silicate glass (BPSG).

In example embodiments, the first and the third isolation layer patterns may be formed using a material having better gap-filling characteristics than those of the second isolation layer pattern.

In an example embodiment, the first and the third isolation layer patterns may be formed using tonen silazene (TOSZ).

In example embodiments, when the second isolation layer pattern is formed, a first insulation layer may be formed on the substrate to fill the first and the second trenches. An upper portion of the first insulation layer may be planarized to form a first insulation layer pattern and a second insulation layer pattern. The first insulation layer pattern may fill the first trench and the second insulation layer pattern may fill the second trench. The first insulation layer pattern and an upper portion of the second insulation layer pattern may be removed.

In example embodiments, when the first insulation layer is formed to fill the first and the second trenches, the first insulation layer may be formed having a void therein to partially fill the first trench.

In example embodiments, when the first and the second trenches are formed on the substrate, a plurality of first structures and a plurality of second structures may be formed on the substrate. The first structures may be spaced apart from each other at a first distance, and the second structures may be spaced apart from each other at a second distance greater than the first distance. The upper portions of the substrate may be partially removed using the first and the second structures as etching masks.

In example embodiments, when the second isolation layer pattern is formed, a first isolation layer may be formed on the substrate, the first structures and the second structures. The first isolation layer may fill the first and the second trenches, a first space between the first structures, and a second space between the second structures. An upper portion of the first insulation layer may be planarized using the first and the second structures as a planarization endpoint to form a first insulation layer pattern and a second insulation layer pattern. The first insulation layer pattern may be formed between the first structures and in the first trench, and the second insulation layer pattern may be formed between the second structures and in the second trench. The first insulation layer pattern and an upper portion of the second insulation layer pattern may be removed In example embodiments, when the first insulation layer is formed, the first insulation layer may be formed having a void therein to partially fill the first trench and the first space between the first structures.

In an example embodiment, the second isolation layer pattern may be formed to a thickness of about four fifths of a depth of the second trench.

According to example embodiments, there is provided a method of manufacturing a semiconductor device. In the method, a plurality of first structures and a plurality of second structures are formed on a substrate in a first region and a second region, respectively. The first structures are spaced apart from each other at a first distance and the second structures are spaced apart from each other at a second distance greater than the first distance. Each of the first structures has a first tunnel insulation layer pattern and a first floating gate sequentially stacked on the substrate, and each of the second structures has a second tunnel insulation layer pattern and a second floating gate sequentially stacked on the substrate. Upper portions of the substrate are removed using the first and the second structures as etching masks to form a first trench and a second trench in the first and second regions, respectively. The first trench has a first width and the second trench has a second width greater than the first width. A second isolation layer pattern is formed to partially fill the second trench. A first isolation layer pattern and a third isolation layer pattern are formed. The first isolation layer pattern fills the first trench and the third isolation layer pattern is formed on the second isolation layer pattern and fills a remaining portion of the second trench. A first dielectric layer pattern and a second dielectric layer pattern are formed. The first dielectric layer pattern is formed on the first floating gate and the first isolation layer pattern and the second dielectric layer pattern is formed on the second floating gate. A first control gate and a second control gate are formed on the first and the second dielectric layer patterns, respectively.

In an example embodiment, the second isolation layer pattern may be formed using BPSG.

In an example embodiment, the first and the third isolation layer patterns may be formed using TOSZ.

In example embodiments, when the second isolation layer pattern is formed, a first insulation layer may be formed on the substrate and the first and the second structures. The first insulation layer may fill the first and the second trenches, a first space between the first structures, and a second space between the second structures. An upper portion of the first insulation layer may be planarized using the first and the second structures as a planarization endpoint to form a first insulation layer pattern and a second insulation layer pattern. The first insulation layer pattern may fill the first trench and the first space between the first structures and the second insulation layer pattern may fill the second trench and the second space between the second structures. The first insulation layer pattern and an upper portion of the second insulation layer pattern may be removed.

In example embodiments, when the first insulation layer is formed, the first insulation layer may be formed having a void therein to partially fill the first trench and the first space between the first structures.

In example embodiments, when the first insulation layer pattern and the upper portion of the second insulation layer pattern are removed, a dry etching process may be performed using an etching gas including hydrogen fluoride (HF).

In example embodiments, when the first insulation layer pattern and the upper portion of the second insulation layer pattern are removed, a wet etching process may be performed using a solution including about 80 percent by weight to about 99.9 percent by weight of sulfuric acid, about 0.01 percent by weight to about 10 percent by weight of hydrogen fluoride and about 0.1 percent by weight to about 10 percent by weight of deionized water.

According to example embodiments, there is provided a semiconductor device. The semiconductor device comprises a plurality of first gate structures, a plurality of second gate structures, a first isolation layer pattern, a second isolation layer pattern, and a third isolation layer pattern. A substrate is divided into a first region and a second region. The plurality of first gate structures includes a first tunnel insulation layer pattern, a first floating gate, a first dielectric layer pattern and a first control gate sequentially stacked on the substrate in the first region. The plurality of second gate structures includes a second tunnel insulation layer pattern, a second floating gate, a second dielectric layer pattern and a second control gate sequentially stacked on the substrate in the second region. The first isolation layer pattern fills a first trench at an upper portion of the substrate adjacent to the first gate structures. The first trench has a first width. The second isolation layer pattern fills a lower portion of a second trench at an upper portion of the substrate adjacent to the second gate structures. The second trench has a second width greater than the first width. A third isolation layer pattern fills a remaining portion of the second trench.

In an example embodiment, the second isolation layer pattern may include BPSG and the first and the third isolation layer patterns may include TOSZ.

According to example embodiments, a first trench having a relatively small width may be filled with a first material having good gap-filling characteristics to form a first isolation layer having no voids therein. A second trench having a relatively large width may be partially filled with a second material having a low thermal shrinkage during an annealing process, and then a remaining portion of the second trench may be filled with a third material having good gap-filling characteristics, thereby to form a second isolation layer that may have a low thermal shrinkage and few or no voids therein. The first and the third materials may be substantially the same. Accordingly, an isolation layer structure having good characteristics may be efficiently formed by a simple process.

BRIEF DESCRIPTION OF THE DRAWINGS

Example embodiments will be more clearly understood from the following detailed description taken in conjunction with the accompanying drawings. FIGS. 1 to 22 represent non-limiting, example embodiments as described herein.

DETAILED DESCRIPTION OF THE EMBODIMENTS

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout the description. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising,"—when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, example embodiments will be explained in detail with reference to the accompanying drawings.

FIGS. 2 to 8 are cross-sectional views illustrating a method of forming an isolation layer in accordance with example embodiments.

Figure 2:
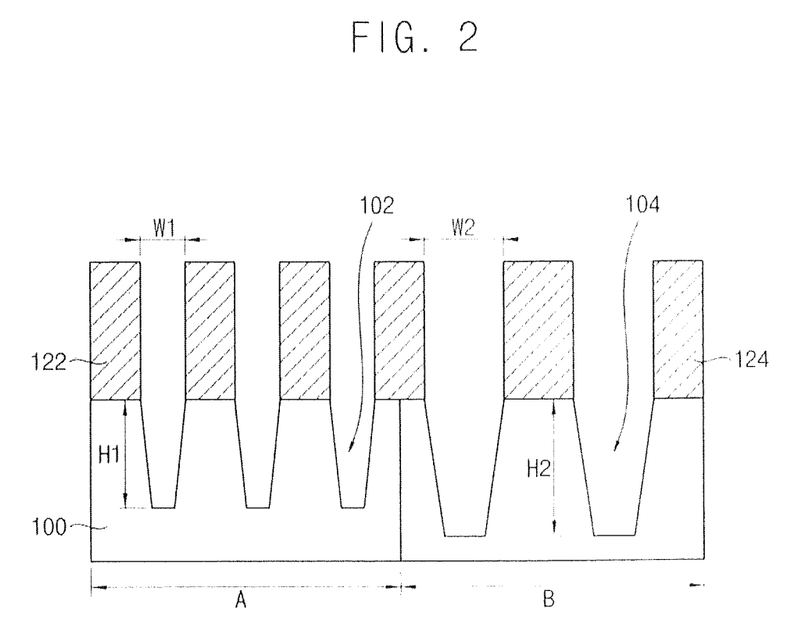
FIGS. 2 to 8 are cross-sectional views illustrating a method of forming an isolation layer in accordance with example embodiments.

Referring to FIG. 2, a substrate 100 that may be divided into a first region A and a second region B may be prepared. In example embodiments, the first region A may be a memory cell region in which memory cells are formed, and the second region B may be a peripheral circuit region in which peripheral circuits are formed.

The substrate 100 may include a semiconductor substrate, such as a silicon substrate, germanium substrate or a silicon-germanium substrate, a substrate having a semiconductor layer and an insulation layer such as a silicon-on-insulator (SOI) substrate or a germanium-on-insulator (GOI) substrate, or a single crystalline metal oxide substrate.

A plurality of first structures 122 spaced apart from each other may be formed on the substrate 100 in the first region A, and a plurality of second structures 124 spaced apart from each other may be formed on the substrate 100 in the second region B. In example embodiments, a first distance W1 between the first structures 122 in the first region A may be less than a second distance W2 between the second structures 124 in the second region B.

In example embodiments, the first and the second structures 122 and 124 may be a gate structure, a layer structure, a wiring structure, a mask structure, etc., and may have a structure substantially the same as each other.

Upper portions of the substrate 100 may be removed using the first and the second structures 122 and 124 as etching masks to form first and second trenches 102 and 104 in the first and second regions A and B, respectively, of the substrate 100, The first distance W1 between the first structures 122 is less than the second distance W2 between the second structures 124, and thus a first width of the first trench 102 in the first region A may be less than a second width of the second trench 104 in the second region B. In example embodiments, the first and the second widths may be gradually reduced as depths of the trenches 102 and 104 become deeper, and may be substantially equal to the first and second distances W1 and W2 at upper portions thereof, respectively.

A first depth H1 of the first trench 102 may be less than a second depth H2 of the second trench 104.

In example embodiments, after forming the first and the second trenches 102 and 104, an annealing process may be performed on the substrate 100 to cure damage to the substrate 100 generated during the formation of the trenches 102 and 104.

Figure 3:
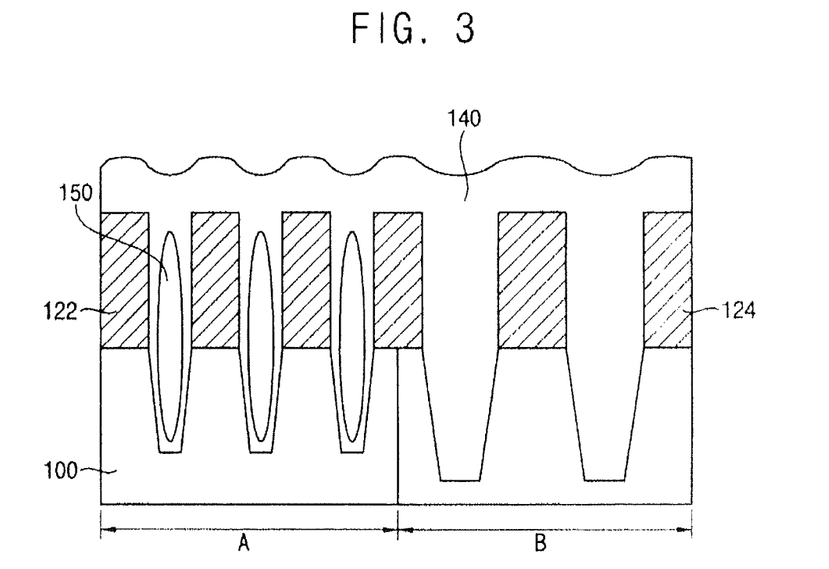

Referring to FIG. 3, a first insulation layer 140 may be formed on the first and the second structures 122 and 124 and the substrate 100 exposed by the first and the second trenches 102 and 104.

In example embodiments, the first insulation layer 140 may be formed using an oxide having low thermal shrinkage and low gap-filling characteristics by a chemical vapor deposition (CVD) process. For example, the first insulation layer 140 may be formed using an oxide having impurities, such as boro phospho silicate glass (BPSG). Accordingly, the first trench 102 having a relatively small width may not be completely filled with the first insulation layer 140, and a void 150 may be formed in the first trench 102 and between the first structures 122. In contrast, the second trench 104 having a relatively large width may be sufficiently filled with the first insulation layer 140, and no void may be formed therein.

Figure 4:
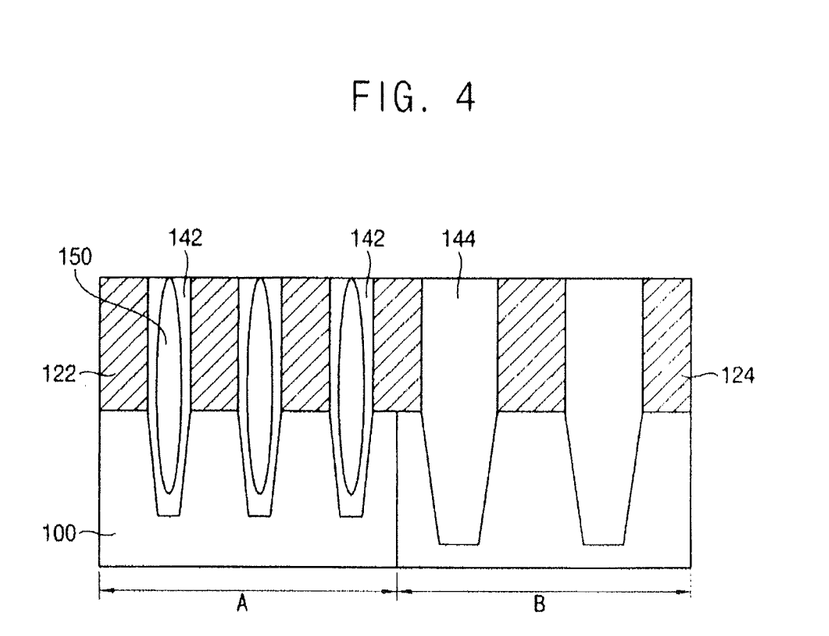

Referring to FIG. 4, an upper portion of the first insulation layer 140 may be removed by a planarization process. In an example embodiment, the planarization process may be performed using top surfaces of the first and the second structures 122 and 124 as a planarization endpoint. Accordingly, a first insulation layer pattern 142 including the void 150 therein may be formed in the first trench 102 and between the first structures 122, and a second insulation layer pattern 144 may be formed in the second trench 104 and between the second structures 124.

Figure 5:
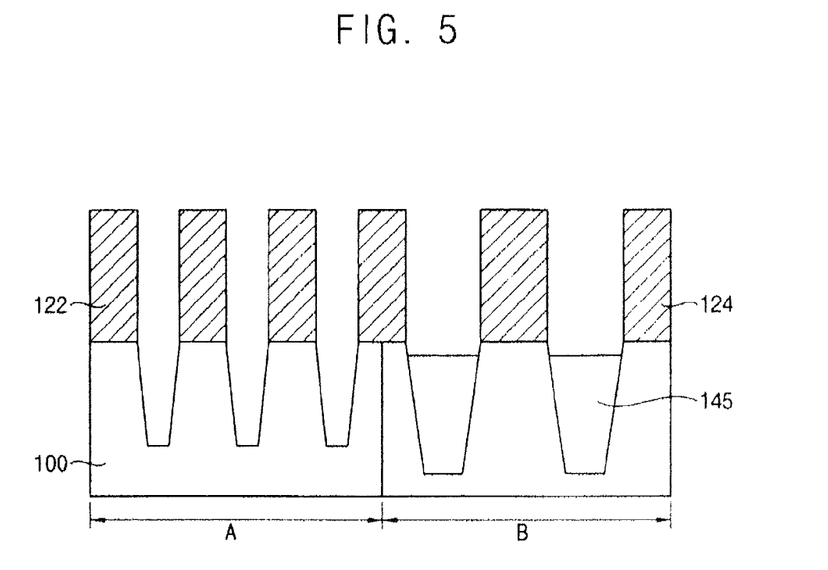

Referring to FIG. 5, an upper portion of the second insulation layer pattern 144 and the first insulation layer pattern 142 may be removed. In an example embodiment, the upper portion of the second insulation layer pattern 144 and the first insulation layer pattern 142 may be removed by a dry etching process. The dry etching process may be performed using an etching gas having an etch selectivity between the first and the second structures 122 and 124 versus the first and the second insulation layer patterns 142 and 144. In another example embodiment, the upper portion of the second insulation layer pattern 144 and the first insulation layer pattern 142 may be removed by a wet etching process. The wet etching process may be performed using an etching solution having an etch selectivity between the first and the second structures 122 and 124 versus the first and the second insulation layer patterns 142 and 144.

The first insulation layer pattern 142 has the void 150 therein, and thus the first insulation layer pattern 142 may be sufficiently removed when the upper portion of the second insulation layer pattern 144 is removed in the etching process. Accordingly, the first trench 102 may be exposed again. The remaining portion of the second insulation layer pattern 144 may be referred to as a second isolation layer pattern 145. In an example embodiment, the second isolation layer pattern 145 may be formed to a thickness of about four fifths of a depth of the second trench 104.

Figure 6:
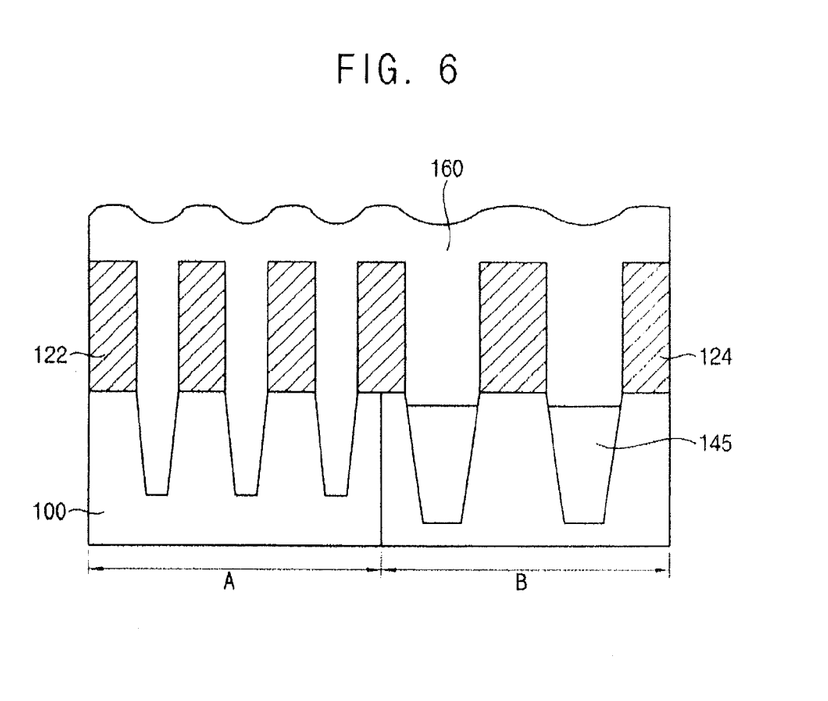

Referring to FIG. 6, a second insulation layer 160 may be formed on the second isolation layer pattern 145, the first and the second structures 122 and 124, and the substrate 100 exposed by the first trench 102.

In example embodiments, the second insulation layer 160 may be formed using an oxide having good gap-filling characteristics by a CVD process.

For example, the second insulation layer 160 may be formed using tonen silazene (TOSZ), flowable oxide (FOX), spin on glass (SOG), and/or the like. Accordingly, the first trench 104 having a relatively small width may be sufficiently filled with the second insulation layer 160 with no void therein.

Figure 7:
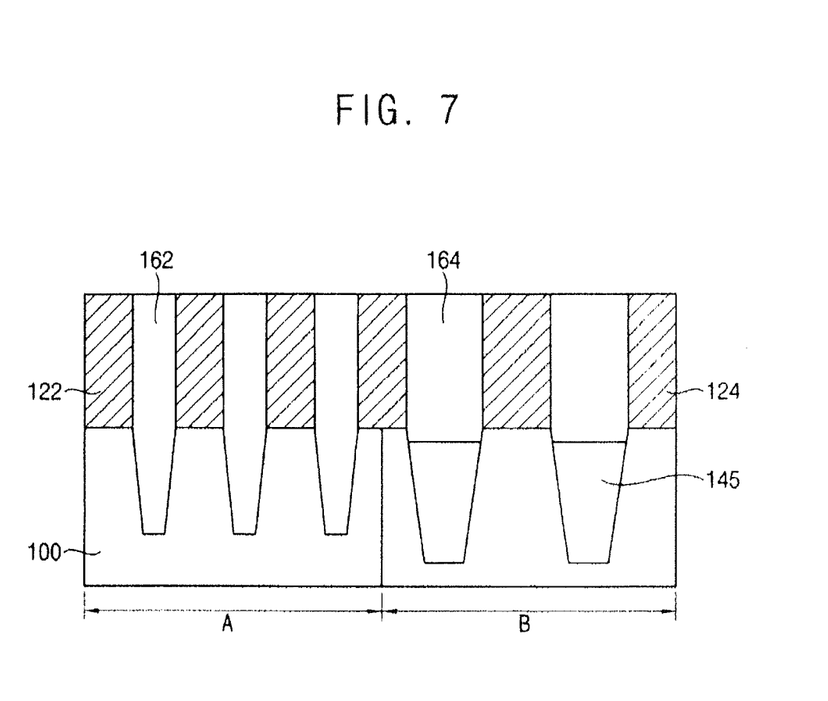

Referring FIG. 7, an upper portion of the second insulation layer 160 may be removed by a planarization process. In an example embodiment, the planarization process may be performed using the top surfaces of the first and the second structures 122 and 124 as a planarization endpoint. Accordingly, a third insulation layer pattern 162 may be formed in the first trench 102 and between the first structures 122, and a fourth insulation layer pattern 164 may be formed on the second isolation layer pattern 145 in the second trench 104 and between the second structures 124.

Figure 8:
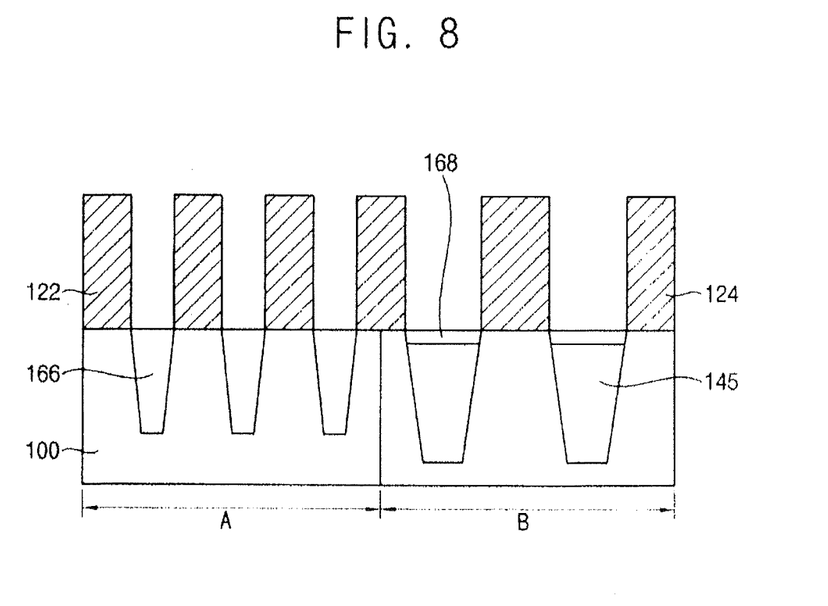

Referring to FIG. 8, upper portions of the third and the fourth insulation layer patterns 162 and 164 may be removed to form a first isolation layer pattern 166 and a third isolation layer pattern 168. In example embodiments, the first and the third isolation layer patterns 166 and 168 may have top surfaces substantially equal to or higher than that of the substrate 100. Hereinafter, the second and the third isolation layer patterns 145 and 168 may be referred to as a second isolation layer structure.

By performing the aforementioned processes, the first isolation layer pattern 166 may be formed on the substrate 100 in the first region A, and the second isolation layer structure may be formed on the substrate 100 in the second region B. No void may be formed in the first isolation layer pattern 166 and the second isolation layer structure. Additionally, the second isolation layer pattern 145 having relatively low thermal shrinkage characteristics occupies a large portion of the second isolation layer structure, so that the second isolation layer structure may not shrink much during a subsequent annealing process. Meanwhile, the first and the third isolation layer patterns 166 and 168 may have relatively high thermal shrinkage characteristics; however, the total volume shrinkage of the first and third isolation layer patterns 166 and 168 during the subsequent annealing process may not be large because the total volume of the first and third isolation layer patterns 166 and 168 is not very large when compared to that of the second isolation layer pattern 145. Therefore, the first isolation layer pattern 166 and the second isolation layer structure may not result in high stress on the substrate 100 and layers adjacent thereto, and defects may not be generated therein.

Accordingly, in accordance with example embodiments, isolation layers having good characteristics may be formed effectively by a simple process.

In the above illustrated method, the first and the second trenches 102 and 104 are formed using the first and the second structures as etching masks, and the first and the second insulation layers 140 and 160 are formed on the substrate 100 and the first and the second structures to fill the first and second trenches 102 and 104, thereby forming isolation layers. However, in other embodiments, after removing the first and the second structures, the first and the second insulation layers 140 and 160 may be formed on the substrate 100 to form isolation layers.

FIGS. 9 to 21 are cross-sectional views illustrating a method of manufacturing a semiconductor device in accordance with example embodiments. In the method of manufacturing the semiconductor device, processes substantially the same as or similar to those illustrated with reference to FIGS. 2 to 7 may be performed, and thus detailed explanations thereon are omitted.

Figure 9:
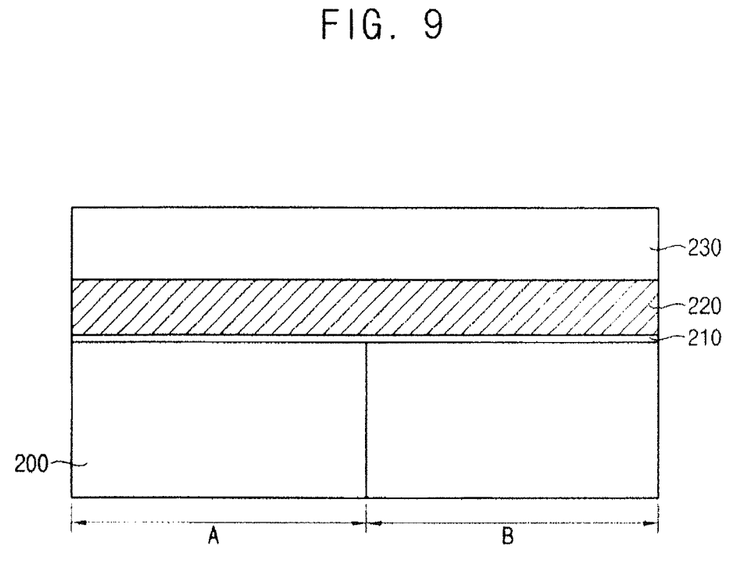
FIGS. 9 to 21 are cross-sectional views illustrating a method of manufacturing a semiconductor device in accordance with example embodiments.

Referring to FIG. 9, a substrate 200 that may be divided into a first region A and a second region B may be prepared. In example embodiments, the first region A may be a memory cell region in which memory cells are formed, and the second region B may be a peripheral circuit region in which peripheral circuits are formed. A tunnel insulation layer 210, a floating gate layer 220, and a hard mask layer 230 may be sequentially formed on the substrate 200.

In example embodiments, the tunnel insulation layer 210 may be formed by thermally oxidizing or radically oxidizing a top surface of the substrate 200 or by depositing an oxide layer thereon. In an example embodiment, the tunnel insulation layer 210 may be formed to a thickness of about 50 Å to about 100 Å.

In example embodiments, the floating gate layer 220 may be formed using doped polysilicon and/or a metal. In an example embodiment, the floating gate layer 220 may be formed by a low pressure chemical vapor deposition (LPCVD) using polysilicon, and impurities may be doped thereinto in-situ or ex-situ.

In example embodiments, the hard mask layer 230 may be formed using a nitride such as an oxynitride.

Figure 10:
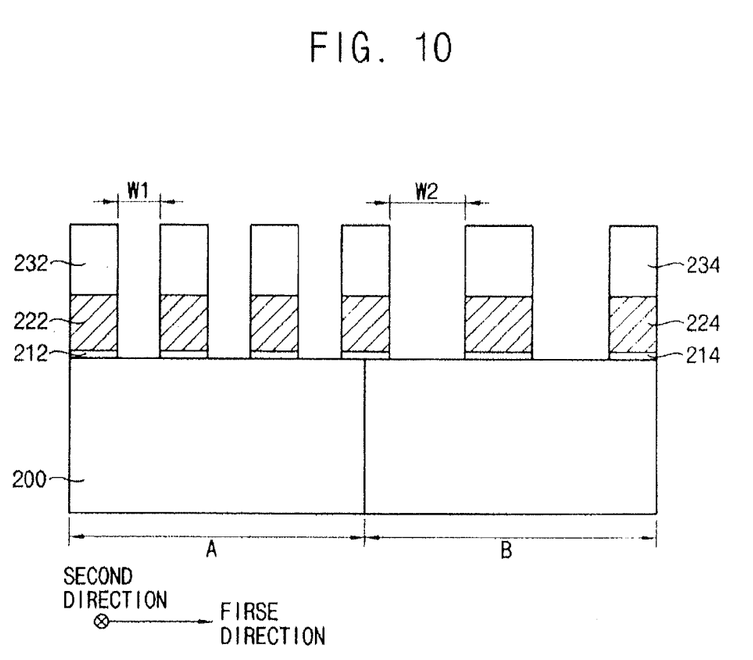

Referring to FIG. 10, the hard mask layer 230 may be patterned by a photolithography process to form first and second hard masks 232 and 234. The floating gate layer 220 and the tunnel insulation layer 210 may be patterned using the first and the second hard masks 232 and 234 as etching masks to form a first floating gate 222 and a first insulation layer pattern 212 in the first region A and a second floating gate 224 and a second insulation layer pattern 214 in the second region B.

Hereinafter, the first tunnel insulation layer pattern 212, the first floating gate 222, and the first hard mask 232 may be referred to as a first structure, and the second tunnel insulation layer pattern 214, the second floating gate 224, and the second hard mask 234 may be referred to as a second structure. In example embodiments, a plurality of first structures spaced apart from each other may be formed along a first direction substantially parallel to a top surface of the substrate 200, and each of the first structures may be formed to have a linear shape extending along a second direction substantially perpendicular to the first direction.

Likewise, in example embodiments, a plurality of second structures spaced apart from each other may be formed along the first direction, and each of the second structures may be formed to have a linear shape extending along the second direction. Alternatively, the second structures may be formed to have an island shape.

In example embodiments, a first distance W1 between the first structures 122 in the first region A may be less than a second distance W2 between the second structures 124 in the second region B.

Figure 11:
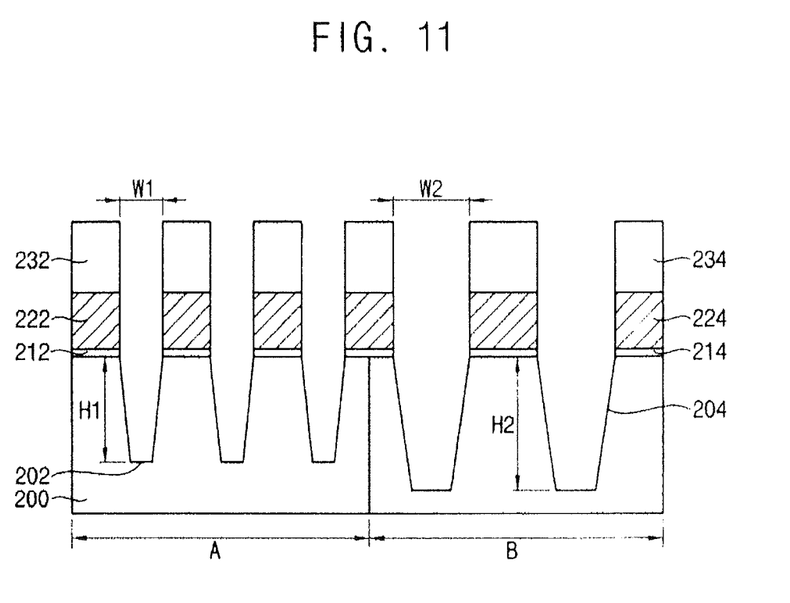

Referring to FIG. 11, upper portions of the substrate 200 may be removed using the first and the second structures as etching masks to form first and second trenches 202 and 204 on the substrate 200 in the first and second regions A and B, respectively The first distance W1 between the first structures may be less than the second distance W2 between the second structures, and thus a first width of the first trench 202 in the first region A may be less than a second width of the second trench 204 in the second region B. In example embodiments, the first and the second widths may be gradually reduced as depths of the trenches 202 and 204 become deeper, and may be substantially equal to the first and second distances W1 and W2 at upper portions thereof, respectively. In an example embodiment, the first width may be about 30 nm and the second width may be about 60 nm. Additionally, a first depth H1 of the first trench 202 may be less than a second depth H2 of the second trench 204.

In example embodiments, after forming the first and the second trenches 202 and 204, an annealing process may be performed on the substrate 200 to cure damage to the substrate 200 generated during the formation of the trenches 202 and 204.

Figure 12:
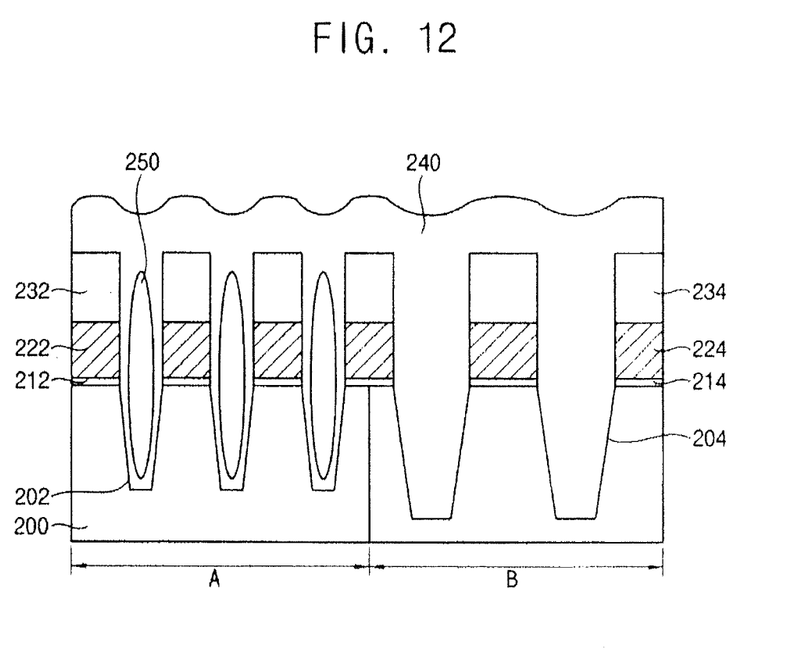

Referring to FIG. 12, a first insulation layer 240 may be formed on the first and the second structures and the substrate 200 exposed by the first and the second trenches 202 and 204. In an example embodiment, the first insulation layer 240 may be formed using an oxide having impurities, such as boro phospho silicate glass (BPSG). A void 250 may be formed in the first trench 202 and between the first structures. The second trench 204 may be sufficiently filled with the first insulation layer 240, and no void may be formed therein.

Figure 13:
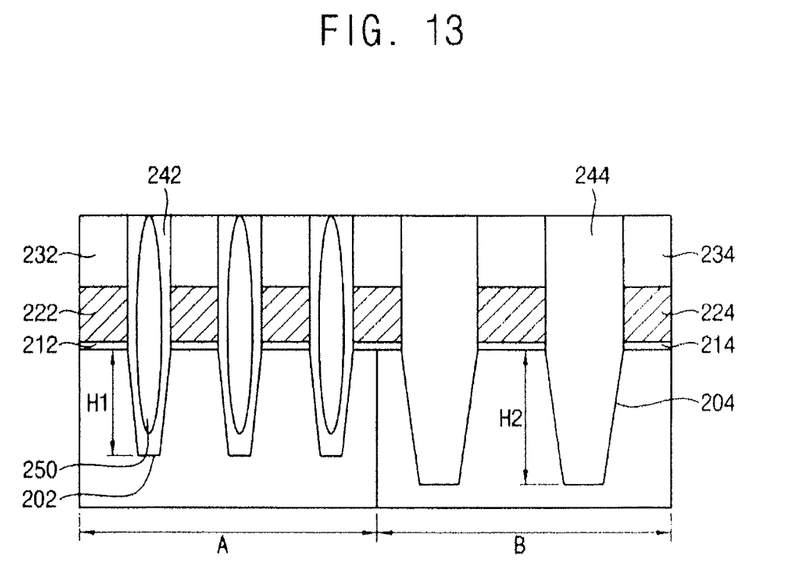

Referring to FIG. 13, an upper portion of the first insulation layer 240 may be removed by a planarization process. In an example embodiment, the planarization process may be performed using top surfaces of the first and the second hard masks 232 and 234 as a planarization endpoint. Accordingly, a first insulation layer pattern 242 including the void 250 therein may be formed in the first trench 202 and between the first structures, and a second insulation layer pattern 244 may be formed in the second trench 204 and between the second structures.

Figure 14:
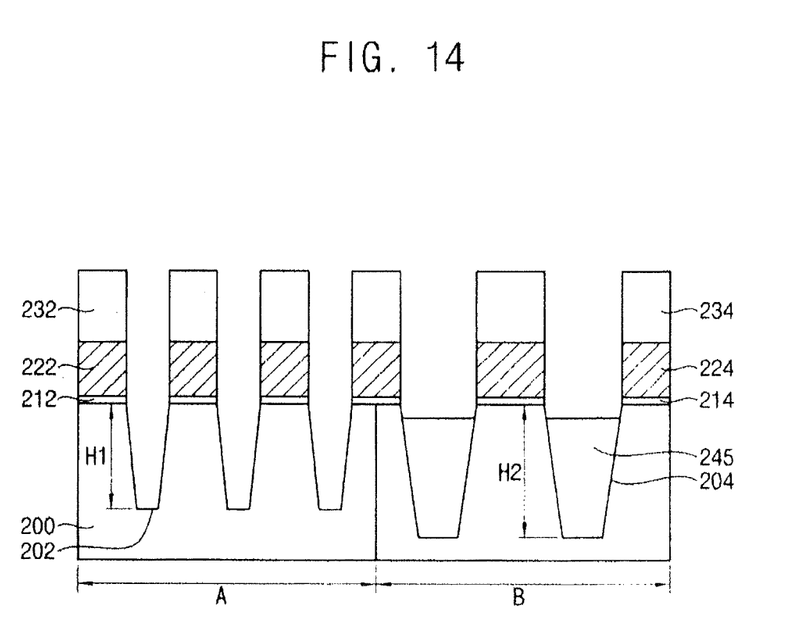

Referring to FIG. 14, the first insulation layer pattern 242 and an upper portion of the second insulation layer pattern 244 may be removed. In an example embodiment, the first insulation layer pattern 242 and the upper portion of the second insulation layer pattern 244 may be removed by a dry etching process. The dry etching process may be performed using an etching gas, such as hydrogen fluoride (HF) having an etch selectivity between the first and the second tunnel insulation layer patterns 212 and 214 versus the first and the second insulation layer patterns 242 and 244. The etching gas may further include deionized water (DIW) vapor. The etching process may be performed in an adjustable pressure chamber at room temperature or a temperature of below about 100° C.

In another example embodiment, the etching process may be performed using buffered oxide etch (BOE) solution including hydrogen fluoride (HF). Particularly, the etching process may be performed using a solution including about 80 percent by weight to about 99.9 percent by weight of organic solvents, about 0.01 percent by weight to about 10 percent by weight of hydrogen fluoride and about 0.1 percent by weight to about 10 percent by weight of deionized water. The organic solvents may include polar solvents, such as sulfuric acid, alcohol, carboxylic acid, carbonyl ether or ester, and/or the like. The etching process may be performed at room temperature or at a temperature of below about 100° C.

The first insulation layer pattern 242 may be sufficiently removed when the upper portion of the second insulation layer pattern 244 is removed in the etching process. Hereinafter, the remaining portion of the second insulation layer pattern 244 may be referred to as a second isolation layer pattern 245. In an example embodiment, the second isolation layer pattern 245 may be formed to a thickness of about four fifths of a depth of the second trench 204.

Figure 15:
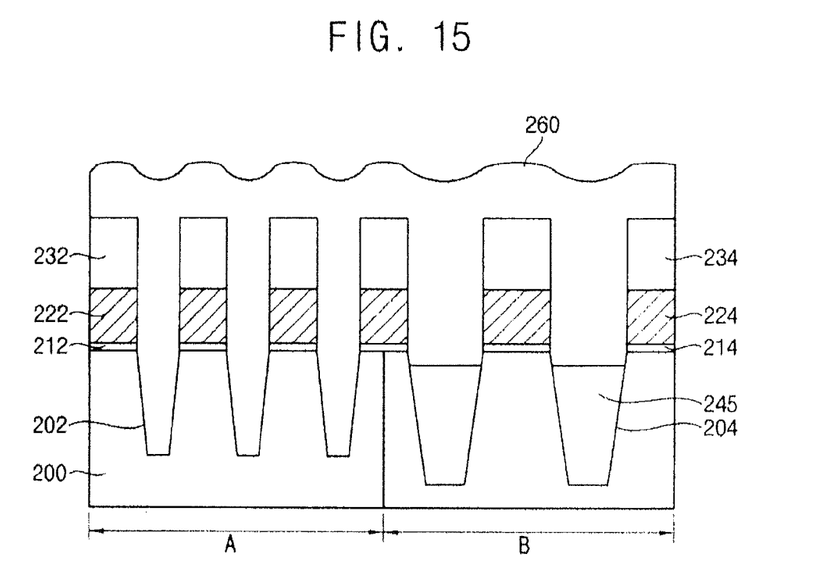

Referring to FIG. 15, a second insulation layer 260 may be formed on the second isolation layer pattern 245, the first and the second structures, and the substrate 200 exposed by the first trench 202. For example, the second insulation layer 260 may be formed using tonen silazene (TOSZ), flowable oxide (FOX), spin on glass (SOG), and/or the like. Accordingly, the first trench 202 having a relatively small width may be sufficiently filled with the second insulation layer 260 having no void therein.

Figure 16:
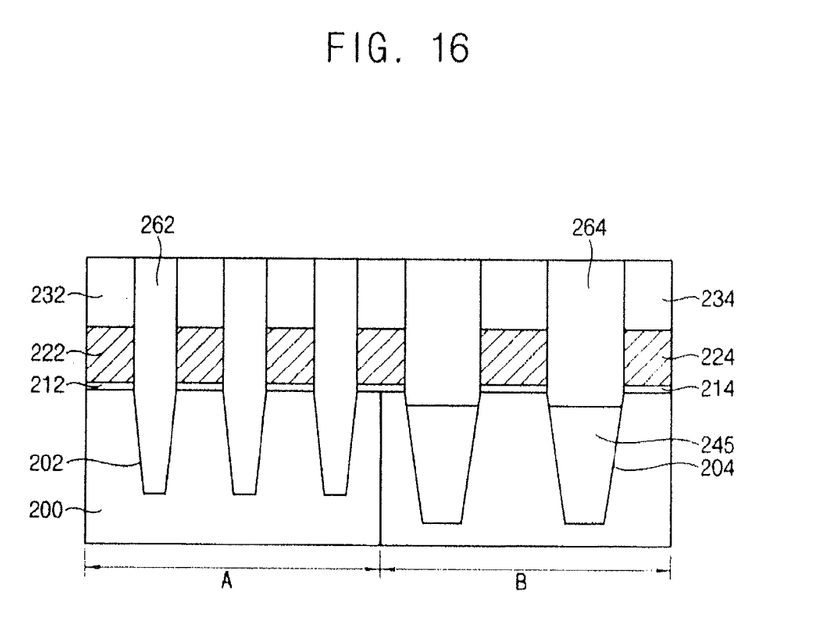

Referring to FIG. 16, an upper portion of the second insulation layer 260 may be removed by a planarization process. In an example embodiment, the planarization process may be performed using the top surfaces of the first and the second hard masks 232 and 234 as a planarization endpoint. Accordingly, a third insulation layer pattern 262 may be formed in the first trench 202 and between the first structures, and a fourth insulation layer pattern 264 may be formed on the second isolation layer pattern 245 in the second trench 204 and between the second structures.

Figure 17:
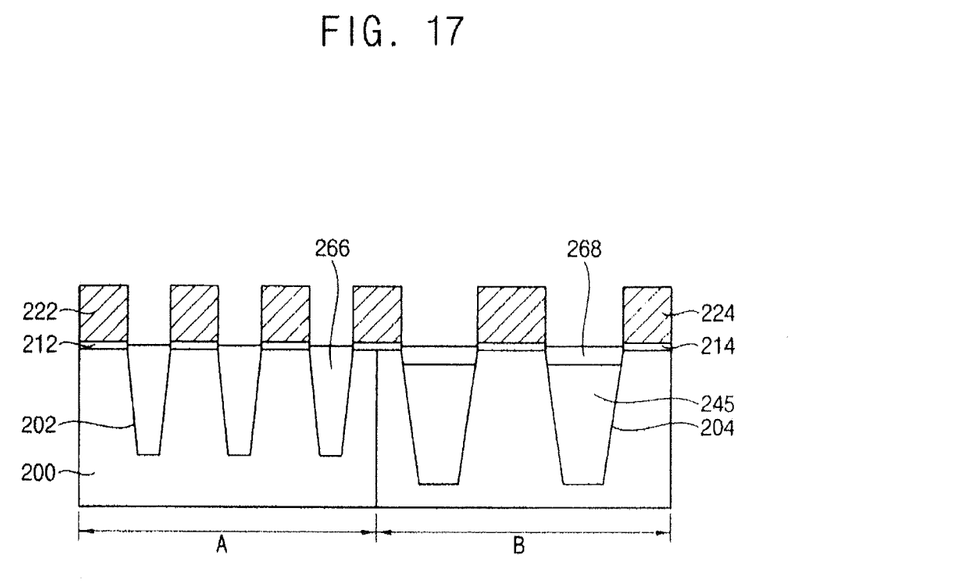

Referring to FIG. 17, upper portions of the third and the fourth insulation layer patterns 262 and 264 may be removed to form a first isolation layer pattern 266 and a third isolation layer pattern 268. Hereinafter, the second and the third isolation layer patterns 245 and 268 may be referred to as a second isolation layer structure.

In an example embodiment, the first and the third isolation layer patterns 266 and 268 may have top surfaces substantially equal to those of the first and the second tunnel insulation layer patterns 212 and 214. Alternatively, the first and the third isolation layer patterns 266 and 268 may have top surfaces substantially equal to or higher than that of the substrate 200. FIG. 17 shows the case in which the top surfaces of the first and the third isolation layer patterns 266 and 268 are between those of the first and the second tunnel insulation layer patterns 212 and 214 and that of the substrate 200.

The first and the second hard mask patterns 232 and 234 may be removed.

Figure 18:
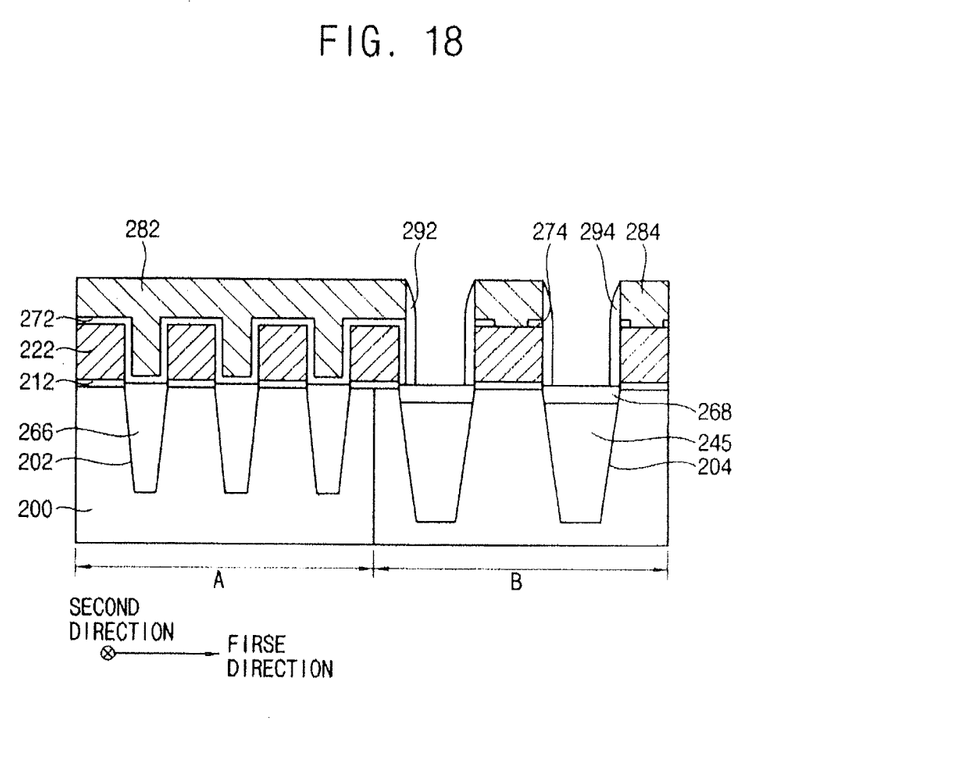

Referring to FIG. 18, a dielectric layer may be formed on the first and the second floating gates 222 and 224, the first and the second tunnel insulation layer patterns 212 and 214, and the first and the third isolation layer patterns 266 and 268.

The dielectric layer may be formed using an oxide and/or a nitride. In an example embodiment, the dielectric layer may be formed to have an ONO layer structure including an oxide layer/nitride layer/oxide layer. Alternatively, the dielectric layer may be formed using a metal oxide having a high dielectric constant, such as, hafnium oxide, titanium oxide, tantalum oxide, zirconium oxide, and/or aluminum oxide. In an example embodiment, the dielectric layer may be formed to have a thickness of about 100 Å to about 200 Å.

In example embodiments, the dielectric layer may be partially removed to form a first dielectric layer pattern 272 and a second dielectric layer pattern 274.

Particularly, a portion of the dielectric layer on the second floating gate 224 may be partially removed and a portion of the dielectric layer on the third isolation layer pattern 268 may be removed, so that a second dielectric layer pattern 274 may be formed on the second floating gate 224. A portion of the dielectric layer in the first region A may be referred to as the first dielectric layer pattern 272.

A control gate layer may be formed on the first and the second dielectric layer patterns 272 and 274, the second floating gate 224, and the third isolation layer pattern 268.

The control gate layer may be formed using doped polysilicon, a metal, a metal nitride and/or a metal silicide. In an example embodiment, the control gate layer may be formed to have a multi-layered structure including a doped polysilicon layer, an ohmic layer, a diffusion barrier layer, an amorphous layer and/or a metal layer sequentially stacked.

For example, the ohmic layer may be formed using titanium (Ti), tantalum (Ta), tungsten (W), molybdenum (Mo) and/or an alloy of thereof. The diffusion barrier layer may be formed using tungsten nitride, titanium nitride and/or tantalum nitride. The amorphous layer may be formed using a refractory metal silicide, such as amorphous tungsten silicide (WSix), amorphous titanium silicide (TiSix), amorphous molybdenum silicide (MoSix), and/or amorphous tantalum silicide (TaSix). The metal layer may be formed using tungsten, titanium, tantalum, molybdenum and/or an alloy of thereof. In an example embodiment, the control gate layer may be formed to a thickness of about 500 Å to about 1000 Å.

By patterning the control gate layer, a first control gate 282 may be formed on the first dielectric layer pattern 272, and a second control gate 284 may be formed on the second dielectric layer pattern 274 and the second floating gate 224. The first and the second dielectric layer patterns 272 and 274, the first and the second floating gates 222 and 224, and the first and the second tunnel insulation layer patterns 212 and 214 may be patterned while or after the first and the second control gates 282 and 284 are formed.

In example embodiments, a plurality of first control gates 282 spaced apart from each other along the second direction may be formed, and each of the first control gates 282 may be formed to have a linear shape extending along the first direction. Likewise, a plurality of first dielectric layer patterns 272 spaced apart each from other along the second direction may be formed, and each of the first dielectric layer patterns 272 may be formed to have a linear shape extending along the first direction. Additionally, a plurality of first floating gates 222 and a plurality of first tunnel insulation layer patterns 212 may be formed to have an island shape, respectively. The first tunnel insulation layer 212, the first floating gate 222, the first dielectric layer pattern 272, and the first control gate 282 sequentially stacked on the substrate 100 may define a first gate structure.

In example embodiments, a plurality of second control gates 284, a plurality of second dielectric layer patterns 274, a plurality of second floating gates 224, and a plurality of second tunnel insulation layer patterns 214 may be formed to have an island, respectively.

Impurities may be doped into upper portions of the substrate 200 adjacent to the first and second gate structures by an ion implantation process to form a low concentration impurity region (not shown).

A first spacer 292 and a second spacer 294 may be formed on sidewalls of the first and the second gate structures, respectively. Particularly, after a spacer layer covering the first and the second gate structures is formed on the substrate 200 and the first and the third isolation layer patterns 266 and 268, the spacer layer may be etched by an anisotropic etching process to form the first and second spacers 292 and 294. In example embodiments, the spacer layer may be formed to a thickness of about 500 Å using middle temperature oxide (MTO).

Impurities may be doped into upper portions of the substrate 200 adjacent to the first and second gate structures by an ion implantation process using the first and the second gate structures and the first and the second spacers 292 and 294 as ion implantation masks to form a high concentration impurity region (not shown). The low concentration impurity region and the high concentration impurity region may form a lightly doped drain (LDD) structure, and may serve as a source/drain region.

Figure 19:
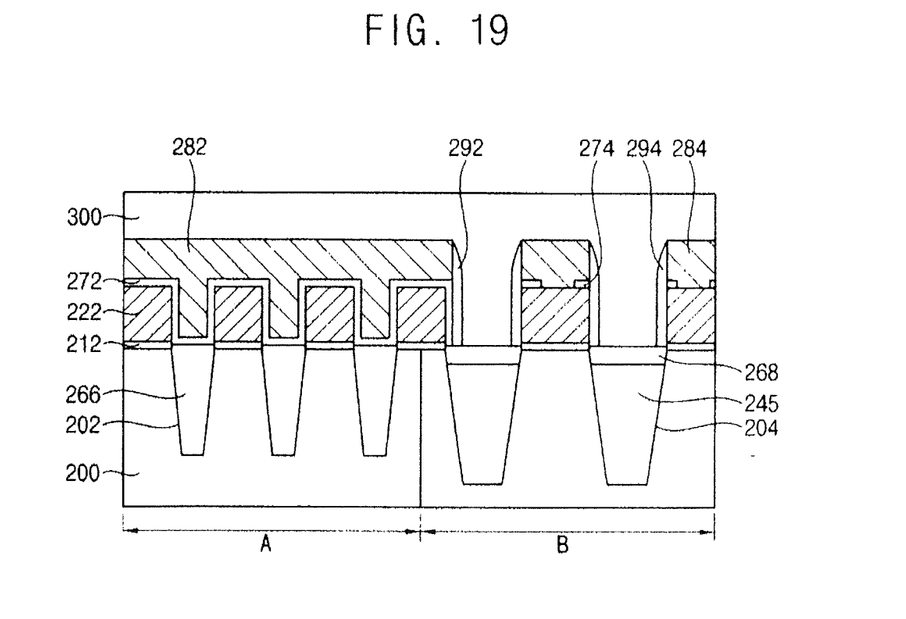

Referring to FIG. 19, a first insulating interlayer 300 covering the first and the second gate structures and the first and the second spacers 292 and 294 may be formed on the substrate 200 and the first and the third isolation layer patterns 266 and 268. The first insulating interlayer 300 may be formed using an oxide by a CVD process.

In example embodiments, the first insulating interlayer 300 may be formed by a high density plasma chemical vapor deposition (HDP-CVD) process. Particularly, a first HDP-CVD process may be performed to form a layer having a thickness of about 2000 Å, and etched by a wet etching process. A second HDP-CVD process may be performed to form a layer having a thickness above about 6000 Å, and planarized to form the first insulating interlayer 300. In an example embodiment, the first insulating interlayer 300 may be formed to have a multi-layered structure. A capping layer (not shown), an organic layer (not shown), and an anti-reflection layer (not shown) may be further formed on the first insulating interlayer 300.

Figure 20:
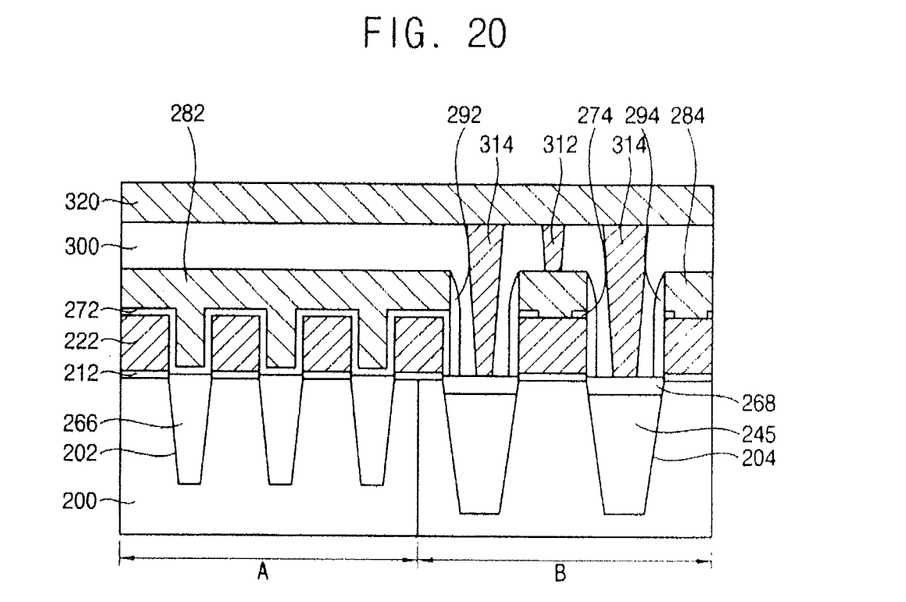

Referring to FIG. 20, the first insulating interlayer 300 may be partially removed to form a first opening (not shown) exposing the second control gate 284 and the third isolation layer pattern 268. A first conductive layer filling the first opening may be formed on the second control gate 284, the third isolation layer pattern 268, and the first insulating interlayer 300. An upper portion of the first conductive layer on the first insulating interlayer 300 may be removed to form a first plug 312 and a second plug 314. The first conductive layer may be formed using a metal, such as aluminum, tungsten and copper, and/or doped polysilicon.

A second conductive layer may be formed on the first insulating interlayer 300 and the first and the second plugs 312 and 314, and patterned to form a first wiring 320. The second conductive layer may be formed using a metal, such as aluminum, tungsten, and/or copper, and/or doped polysilicon. In an example embodiment, the first wiring 320 may be formed to have a linear shape extending along the first direction, and serve as a bit line.

Figure 21:
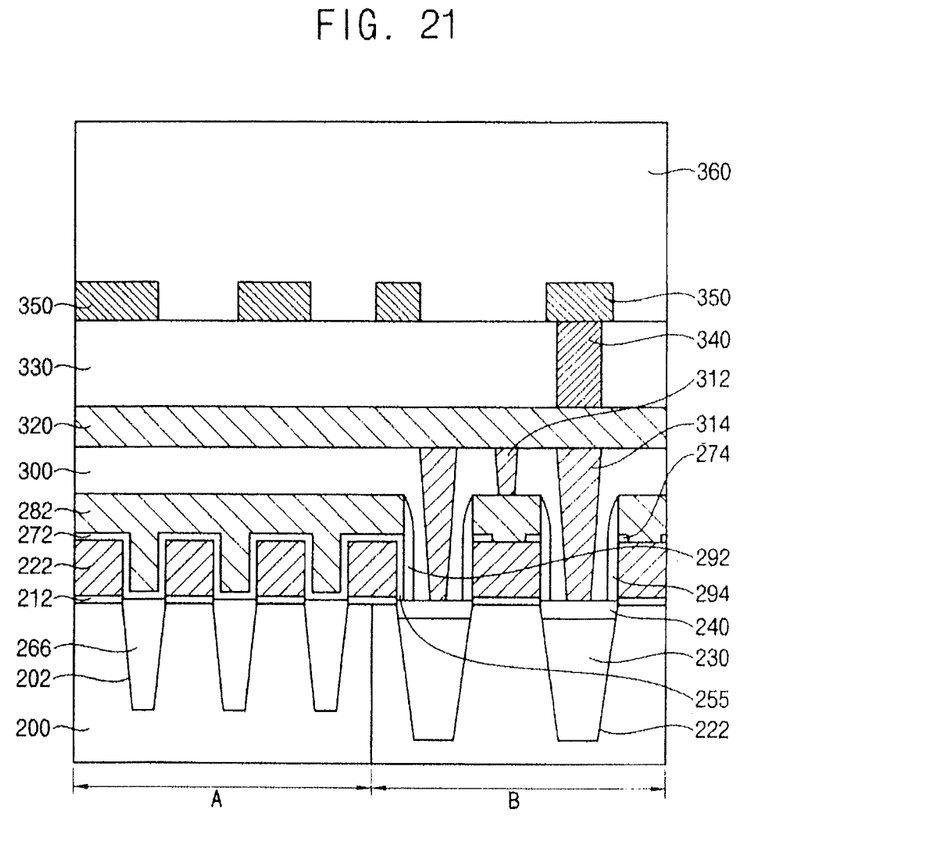

Referring to FIG. 21, a second insulating interlayer 330 covering the first wiring 320 may be formed on the first insulating interlayer 300. In example embodiments, the second insulating interlayer 330 may be formed using a material substantially the same as that of the first insulating interlayer 300. The second insulating interlayer 330 may be partially removed to form a second opening (not shown) exposing the first wiring 320. A third conductive layer filling the second opening may be formed on the first wiring 320 and the second insulating interlayer 330. An upper portion of the third conductive layer on the second insulating interlayer 330 may be removed to form a third plug 340. The third conductive layer may be formed using a metal, such as aluminum, tungsten and/or copper, and/or doped polysilicon.

A fourth conductive layer may be formed on the second insulating interlayer 330 and the third plug 340. A second wiring 350 may be formed by patterning the fourth conductive layer. The fourth conductive layer may be formed using a metal, such as aluminum, tungsten and/or copper, and/or doped polysilicon. In an example embodiment, a plurality of second wirings 350 may be formed, and the second wirings 350 may be formed to have an island shape. A protection layer 360 covering the second wiring 350 may be formed on the second insulating interlayer 330 to complete the semiconductor device.

Methods of manufacturing a floating gate type flash memory device have been illustrated; however, the scope of the present inventive concept may be applied to other types of memory devices, e.g., a charge trapping type flash memory device, a NOR flash memory device, a PRAM device, a DRAM device, etc. The charge trapping type flash memory device may have a gate structure including a tunnel insulation layer pattern, a charge trapping layer pattern, a blocking layer pattern and a gate electrode sequentially stacked on a substrate.

Figure 22:
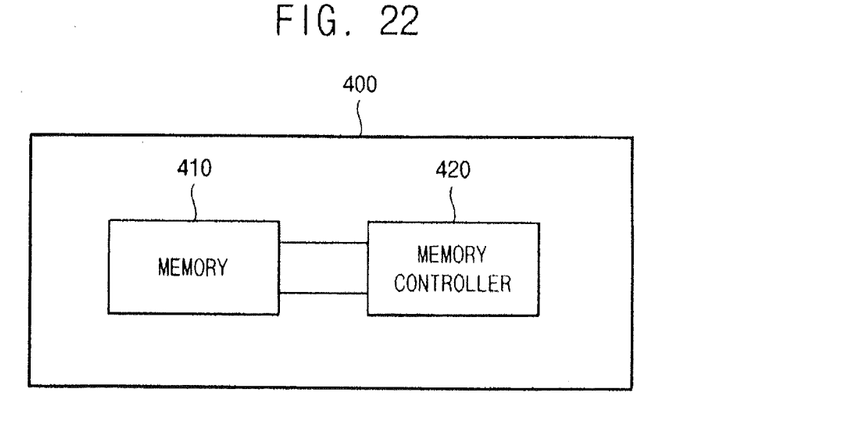
FIG. 22 is a block diagram illustrating a system in accordance with example embodiments.

FIG. 22 is a block diagram illustrating a system in accordance with example embodiments.

Referring to FIG. 22, a system 400 may include a memory 410 and a memory controller 420 electrically connected to each other.

The memory 410 may be a flash memory device or a DRAM device including isolation layers in accordance with example embodiments described above. The flash memory may be a NAND flash memory or a NOR flash memory.

The memory controller 420 may provide signals to control the operation of the memory 410. For example, when the memory 410 is the NAND flash memory, the memory controller 420 may provide command (CMD) and address (ADD) signals to the memory 410. When the memory 410 is the NOR flash memory, the memory controller 420 may provide CMD, ADD, DQ and VPP signals to the memory 410. Accordingly, the memory controller 420 may control the memory 410 by providing various kinds of control signals.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

That which is claimed:

1. A method of forming an isolation layer, comprising:
    forming a first trench and a second trench at upper portions of a substrate, the first and the second trenches having first and second widths, respectively, and the second width being greater than the first width;
    forming a first isolation layer pattern filling the first trench;
    forming a second isolation layer pattern partially filling the second trench; and
    forming a third isolation layer pattern on the second isolation layer pattern and filling a remaining portion of the second trench;
    wherein forming the first and the second trenches on the substrate comprises:
    forming a plurality of first structures and a plurality of second structures on the substrate;
    wherein forming the second isolation layer pattern comprises:
    forming a first insulation layer on the substrate, the first structures and the second structures, the first insulation layer filling the first and the second trenches, a first space between the first structures, and a second space between the second structures;
    planarizing an upper portion of the first insulation layer using the first and the second structures as a planarization endpoint to form a first insulation layer pattern and a second insulation layer pattern, the first insulation layer pattern being formed between the first structures and in the first trench, and the second insulation layer pattern being formed between the second structures and in the second trench; and
    removing the first insulation layer pattern and an upper portion of the second insulation layer pattern;
    wherein forming the first insulation layer comprises:
    forming the first insulation layer having a void therein to partially fill the first trench and the first space between the first structures.

2. The method of claim 1, wherein the second isolation layer pattern comprises a material having a thermal shrinkage lower than those of the first and the third isolation layer patterns.

3. The method of claim 2, wherein the second isolation layer pattern comprises boro-phosphor silicate glass (BPSG).

4. The method of claim 1, wherein the first and the third isolation layer patterns comprise a material having gap-filling characteristics better than those of the second isolation layer pattern.

5. The method of claim 4, wherein the first and the third isolation layer patterns comprise Tonen Silazene (TOSZ).

6. The method of claim 1, wherein
    the first structures are spaced apart from each other at a first distance, and the second structures are spaced apart from each other at a second distance greater than the first distance; and wherein forming the first and second trenches on the substrate further includes:
    partially removing the upper portions of the substrate using the first and the second structures as etching masks.

7. The method of claim 1, wherein the second isolation layer pattern is formed to a thickness of about four fifths of a depth of the second trench.

8. A method of manufacturing a semiconductor device, comprising:
    forming a plurality of first structures and a plurality of second structures on a substrate in a first region and a second region, respectively, the first structures being spaced apart from each other at a first distance, the second structures being spaced apart from each other at a second distance greater than the first distance, each of the first structures having a first tunnel insulation layer pattern and a first floating gate sequentially stacked on the substrate, and each of the second structures having a second tunnel insulation layer pattern and a second floating gate sequentially stacked on the substrate;
    removing upper portions of the substrate using the first and the second structures as etching masks to form a first trench and a second trench in the first and second regions, respectively, the first trench having a first width and the second trench having a second width greater than the first width;
    forming a first isolation layer pattern filling the first trench;
    forming a second isolation layer pattern partially filling the second trench;
    forming a third isolation layer pattern on the second isolation layer pattern and filling a remaining portion of the second trench;
    forming a first dielectric layer pattern and a second dielectric layer pattern, the first dielectric layer pattern being formed on the first floating gate and the first isolation layer pattern, and the second dielectric layer pattern being formed on the second floating gate; and
    forming a first control gate and a second control gate on the first and the second dielectric layer patterns, respectively.

9. The method of claim 8, wherein the second isolation layer pattern comprises boro-phosphor silicate glass (BPSG).

10. The method of claim 8, wherein the first and the third isolation layer patterns comprise Tonen Silazene (TOSZ).

11. The method of claim 8, wherein forming the second isolation layer pattern comprises:
    forming a first insulation layer on the substrate and the first and the second structures, the first insulation layer filling the first and the second trenches, a first space between the first structures, and a second space between the second structures;
    planarizing an upper portion of the first insulation layer using the first and the second structures as a planarization endpoint to form a first insulation layer pattern and a second insulation layer pattern, the first insulation layer pattern filling the first trench and the first space between the first structures, and the second insulation layer pattern filling the second trench and the second space between the second structures; and
    removing the first insulation layer pattern and an upper portion of the second insulation layer pattern.

12. The method of claim 11, wherein forming the first insulation layer comprises:
    forming the first insulation layer having a void therein to partially fill the first trench and the first space between the first structures.

13. The method of claim 11, wherein removing the first insulation layer pattern and the upper portion of the second insulation layer pattern comprises:
    performing a dry etching process using an etching gas comprising hydrogen fluoride (HF).

14. The method of claim 11, wherein removing the first insulation layer pattern and the upper portion of the second insulation layer pattern comprises:
    performing a wet etching process using a solution including about 80 percent by weight to about 99.9 percent by weight of sulfuric acid, about 0.01 percent by weight to about 10 percent by weight of hydrogen fluoride and about 0.1 percent by weight to about 10 percent by weight of deionized water.

* * * * *